US007037789B2

(12) United States Patent
Yamauchi et al.

(10) Patent No.: US 7,037,789 B2
(45) Date of Patent: May 2, 2006

(54) STABILIZATION OF DOPANT CONCENTRATION IN SEMICONDUCTOR DEVICE HAVING EPITAXIALLY-FILLED TRENCH

(75) Inventors: Shoichi Yamauchi, Obu (JP); Hitoshi Yamaguchi, Nisshin (JP)

(73) Assignee: Denso Corporation, Kariya (JP)

( * ) Notice: Subject to any disclaimer, the term of this patent is extended or adjusted under 35 U.S.C. 154(b) by 251 days.

(21) Appl. No.: 10/449,057

(22) Filed: Jun. 2, 2003

(65) Prior Publication Data

US 2003/0224588 A1 Dec. 4, 2003

(30) Foreign Application Priority Data

Jun. 3, 2002 (JP) ............................. 2002-161594

(51) Int. Cl.
 *H01L 21/76* (2006.01)
(52) U.S. Cl. ........................ 438/270; 257/330
(58) Field of Classification Search ........ 438/268–269, 438/197, 221–223, 492, 497, 499–500, 503, 438/507, 700–703, 270; 257/330, 331
See application file for complete search history.

(56) References Cited

U.S. PATENT DOCUMENTS

| 4,466,173 A | | 8/1984 | Baliga |
| 4,528,745 A | | 7/1985 | Muraoka et al. |
| 5,114,749 A | * | 5/1992 | Nishio et al. ............... 427/226 |
| 6,303,446 B1 | * | 10/2001 | Weiner et al. .............. 438/299 |
| 6,406,982 B1 | * | 6/2002 | Urakami et al. ............ 438/492 |
| 6,552,414 B1 | * | 4/2003 | Horzel et al. ............... 257/655 |
| 6,666,915 B1 | * | 12/2003 | Yang et al. .................... 117/3 |
| 6,828,690 B1 | * | 12/2004 | Falster ........................ 257/130 |
| 2001/0049182 A1 | * | 12/2001 | Urakami et al. ............ 438/478 |
| 2002/0100410 A1 | * | 8/2002 | Kim et al. ..................... 117/13 |
| 2002/0127766 A1 | * | 9/2002 | Ries et al. .................... 438/94 |
| 2002/0132412 A1 | * | 9/2002 | Mathew et al. ............. 438/210 |

FOREIGN PATENT DOCUMENTS

| EP | 1 111 685 A1 | | 6/2001 |
| JP | 2002-124474 | * | 4/2002 |

OTHER PUBLICATIONS

Office Action issued from Japanese Patent Office on Jul. 26, 2005 for the corresponding Japanese patent application No. 2002-161594 (a copy and English translation thereof).

* cited by examiner

*Primary Examiner*—Asok Kumar Sarkar
(74) *Attorney, Agent, or Firm*—Posz Law Group, PLC

(57) ABSTRACT

A method for manufacturing a semiconductor device includes: forming a trench in a predetermined layer of a semiconductor substrate; heating the substrate having the trench in a non-oxidizing and non-nitridizing atmosphere containing a dopant or a compound that includes the dopant in order to smooth the surfaces defining the trench and to maintain the dopant concentration in the predetermined layer to be a predetermined concentration before the heating is treated; and forming an epitaxially grown film to fill the trench. The conductivity type of the dopant contained in the non-oxidizing and non-nitridizing atmosphere is the same as that of the dopant initially contained in the predetermined layer.

24 Claims, 12 Drawing Sheets

STABILIZATION OF DOPANT CONCENTRATION IN SEMICONDUCTOR DEVICE HAVING EPITAXIALLY-FILLED TRENCH

CROSS REFERENCE TO RELATED APPLICATION

This application is based on and incorporates herein by reference Japanese Patent Application No. 2002-161594 filed on Jun. 3, 2002.

BACKGROUND OF THE INVENTION

The present invention relates to a semiconductor device, in the manufacturing process of which a trench is filled with an epitaxially grown film, and a method for manufacturing the device.

The inventors of the present invention propose the following method, which is shown in FIGS. 8A to 8F, for forming a trench in a semiconductor layer and filling the trench with an epitaxially grown film in U.S. Pat. No. 6,406,982 (JP-A-2002-124474). In the method, firstly, an n-type drift layer 120 is formed on an $n^+$-type substrate 110 to form a semiconductor substrate 132, and a mask layer 131 is formed by patterning a film deposited on the substrate 132 using photolithography and etching, as shown in FIG. 8A.

Then, the n-type drift layer 120 is partially etched using the mask layer 131 in order to form trenches 111, as shown in FIG. 8B. Then, the mask layer 131 is removed using hydrofluoric acid (HF) aqueous solution, as shown in FIG. 8C. Next, the substrate 132 is heated in non-oxidizing and non-nitridizing atmosphere in order to smooth the surfaces of the trenches 111 and in order to cure the crystallographic defects located in the surfaces, as shown in FIG. 8D. After that, an epitaxially grown film 133 is deposited to fill the trenches 111, as shown in FIG. 8E. Finally, the epitaxially grown film 133 is planarized, as shown in FIG. 8F.

In the method of U.S. Pat. No. 6,406,982, as described, the substrate 132 is heated in the non-oxidizing and non-nitridizing atmosphere before the epitaxially grown film 133 is deposited. The heating enables the epitaxially grown film 133 to be deposited on the inner surfaces of the trenches 111, which has been smoothed and the crystallographic defects in which have been cured. As a result, the crystallographic defects that otherwise would be generated in the epitaxially grown film 133 are prevented.

However, there is a problem in the method of U.S. Pat. No. 6,406,982 that the dopant concentration in the substrate 132 can fluctuate to deviate from the predetermined concentration because the dopants contained in the semiconductor substrate 132 out diffuse during the heating.

SUMMARY OF THE INVENTION

The present invention has been made in view of the above aspects with an object to prevent the dopant concentration in a semiconductor substrate having a trench from fluctuating when the substrate is heated in a non-oxidizing and non-nitridizing atmosphere before an epitaxially grown film is deposited to fill the trenches in order to control the dopant concentration at a predetermined level.

To achieve the above object, a method according to the present invention for manufacturing a semiconductor device includes: forming a trench in a predetermined layer of a semiconductor substrate; heating the substrate having the trench in a non-oxidizing and non-nitridizing atmosphere containing a dopant or a compound that includes the dopant in order to smooth the surfaces of the trench and to maintain the dopant concentration in the predetermined layer to be a predetermined concentration before the heating is treated; and forming an epitaxially grown film to fill the trench. The conductivity type of the dopant contained in the non-oxidizing and non-nitridizing atmosphere is the same as that of the dopant initially contained in the predetermined layer.

Another method according to the present invention for manufacturing a semiconductor device includes: forming a trench in a predetermined layer of a semiconductor substrate; heating the substrate having the trench in a non-oxidizing and non-nitridizing atmosphere containing a dopant or a compound that includes the dopant in order to smooth surfaces of the trench and to diffuse the dopant contained in the non-oxidizing and non-nitridizing atmosphere into the predetermined layer and partially increase a dopant concentration in the predetermined layer to be a predetermined concentration higher than that before the heating is treated; and forming an epitaxially grown film to fill the trench.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 1:
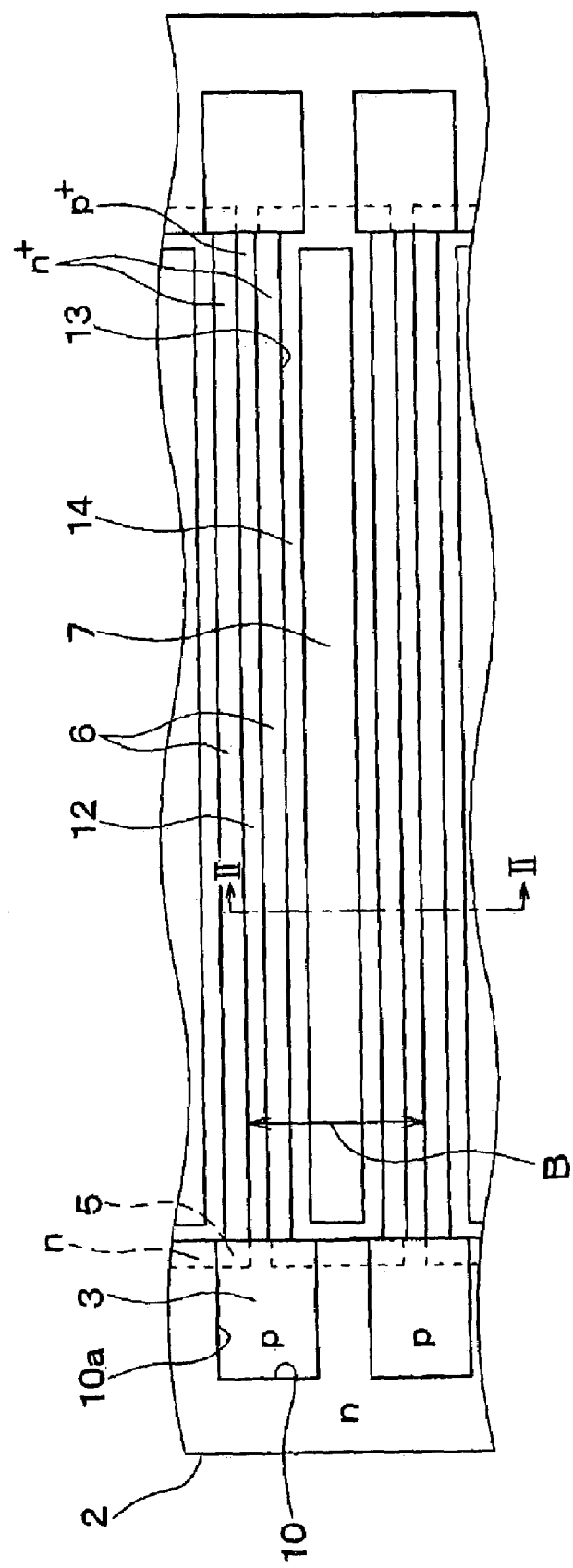
FIG. 1 is a partial schematic plan view of a semiconductor device according to a first embodiment of the present invention.
Figure 2:
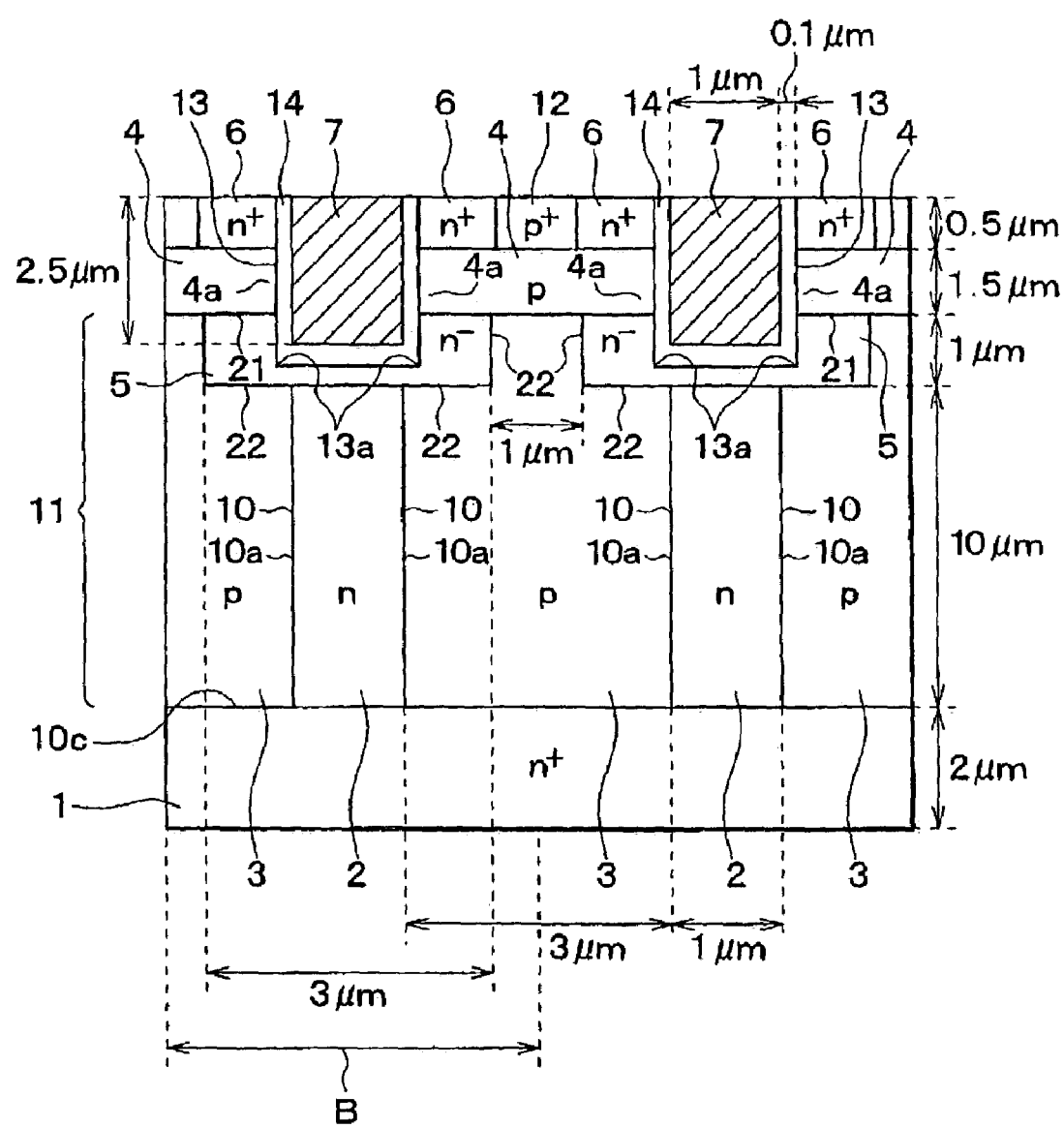
FIG. 2 is a schematic cross-sectional view of the device in FIG. 1 taken along the line II—II.

The present invention will be described in detail with reference to various embodiments, First Embodiment FIG. 1 is a plan view of a power MOSFET having a super junction structure according to a first embodiment of the present invention. FIG. 2 is a cross-sectional view of the power MOSFET taken along the line II—II in FIG. 1. In this power MOSFET, a structure within a range having a width B is a single unit structure, which is repeated a plurality of times to form this power MOSFET. This power MOSFET includes an $n^+$-type substrate 1, n-type drift regions 2, p-type silicon regions 3 as first semiconductor regions 3, p-type base regions 4, upper n-type silicon regions 5 as second semiconductor regions 5, $n^+$-type source regions 6, and gate electrodes 7.

The n+-type substrate 1 forms an n+-type drain region 1, and the thickness of the n+-type substrate 1 is, for example, 2 μm in a vertical direction of the n+-type substrate 1. The substrate 1 has a dopant concentration of $1\times10^{19}$ to $1\times10^{23}$ cm$^{-3}$. The n-type drift regions 2 are located on the n+-type substrate 1 and have, for example, a dopant concentration of $1\times10^{16}$ to $1\times10^{17}$ cm$^{-3}$, a width of 1 μm, and a thickness of 10 μm. These values are selected to ensure that the n-type drift regions 2 can be completely depleted when a predetermined reverse voltage is applied.

The n-type drift regions 2 have sidewall surfaces 10a and bottom surfaces 10c that define first trenches 10, or epitaxial trenches 10. The p-type silicon regions 3 are located in the epitaxial trenches 10. The p-type silicon regions 3 have a dopant concentration of, for example, $1\times10^{15}$ to $1\times10^{17}$ cm$^{-3}$. The p-type silicon regions 3 have, for example, a width of 3 μm and a thickness of 10 μm. However, the p-type silicon regions 3 have, for example, a width of 1 μm at the portion between the upper n-type silicon regions 5, which are described later. The aforementioned values are selected to ensure that the p-type silicon regions 3 can be completely depleted when a predetermined reverse voltage is applied.

The n-type drift regions 2 and the p-type silicon regions 3 are arranged alternately in the directions orthogonal to the moving direction of carriers, that is, in the horizontal directions in FIG. 2. In other words, the n-type drift regions 2 and the p-type silicon regions 3 join at the corresponding pn junctions 10a, which are the sidewall surfaces 10a of the epitaxial trenches 10. The pn junctions 10a are formed intermittently in horizontal directions by the alternate arrangement of the n-type drift regions 2 and the p-type silicon regions 3. A so-called super junction 11 is formed by the alternate arrangement of the n-type drift regions 2 and the p-type silicon regions 3.

The p-type base regions 4 are located on the corresponding p-type silicon regions 3 in direct contact with the p-type silicon region 3. The p-type base regions 4 have, for example, a dopant concentration of $5\times10^{16}$ cm$^{-3}$ and a thickness of 1.5 μm. A p+-type base contact region 12 having a thickness of 0.5 μm is located on the upper surface of each of the p-type base regions 4. The upper n-type silicon regions 5 are located between the top surfaces of the n-type drift regions 2 and the lower surfaces of the p-type base regions 4. The upper n-type silicon regions 5 are in contact with the p-type silicon regions 3 at pn junctions 22. The upper n-type silicon regions 5 are arranged to include substantially all the carrier passages that connect the n-type drift regions 2 and the p-type base regions 4.

In this embodiment, the upper n-type silicon regions 5 have, for example, a dopant concentration of $1\times10^{16}$ cm$^{-3}$ which differs from that of the n-type drift regions 2. However, the dopant concentration of the upper n-type silicon regions 5 may be the same as that of the n-type drift regions 2. The upper n-type silicon regions 5 are also in contact with the p-type base region 4 at pn junctions 21 and further in contact with n-type channel regions 4a, at which n-type channels are formed in the p-type base regions 4. The upper n-type silicon regions 5 are located between the n-type drift regions 2 and the bottom of second trenches 13, or gate trenches 13.

The upper n-type silicon regions 5 are wider than the n-type drift regions 2 and the gate trenches 13. The upper n-type silicon regions 5 have, for example, a width of 3 μm and a thickness of 1 μm. The upper n-type silicon regions 5 are wider than the n-type drift regions 2 and the gate trenches 13 substantially by the length of the n-type drift region 2 and the gate trenches 13 on both sides in the horizontal directions of FIG. 2. The upper n-type silicon regions 5 define the corners 13a of the bottom surfaces of the gate trenches 13.

The n+-type source regions 6 are in contact with the top surfaces of the p-type base regions 4. The n+-type source regions 6 have a thickness of 0.5 μm. The gate electrodes 7 are located on the surfaces of the gate trenches 13, which extend through the base region 4 from the main surface, with gate oxide films 14, or gate insulating films 14, therebetween. In the cross-sectional structure shown in FIG. 2, the gate electrodes 7 have, for example, a width of 1 μm and a depth of 2.5 μm. The gate oxide films 14 have a width of 0.1 μm.

Subsequently, the operation of the power MOSFET of this embodiment will be explained. Positive voltage is applied to the n+-type drain region 1 in FIG. 2, and the n+-type source regions 6 and the p+-type base contact regions 12 are grounded. When the power MOSFET is turned on in this state, that is, when positive voltage is applied to the trench gate electrodes 7, electrons in the p-type base regions 4 are drawn to the n-type channel regions 4a to form n-type channels. The electrons supplied from the n+-type source regions 6 flow in the n-type channel regions 4a, the upper n-type silicon regions 5, and the n-type drift regions 2 to reach the n+-type drain region 1.

When a reverse voltage is applied between the source electrode and the drain electrode of the power MOSFET of this embodiment with no voltage applied to the trench gate electrodes 7, that is, while the power MOSFET is in OFF state, depletion layers extend from the pn junctions 10a between the n-type drift regions 2 and the p-type silicon regions 3, the pn junctions 21 between the p-type base region 4 and the upper n-type silicon regions 5, and the pn junctions 22 between the p-type silicon regions 3 and the upper n-type silicon regions 5 toward each region 2, 3, 4, 5.

When a predetermined reverse voltage is applied, the n-type drift regions 2, the p-type silicon regions 3, and the upper n-type silicon regions 5 are completely depleted. That is, the regions that make up the super junction 11 are completely depleted to permit the power MOSFET to secure high breakdown voltage.

Next, the method for manufacturing the semiconductor device according to this embodiment will be explained. FIGS. 3A to 3J show the steps for manufacturing a semiconductor device according to this embodiment.

Figure 3A:
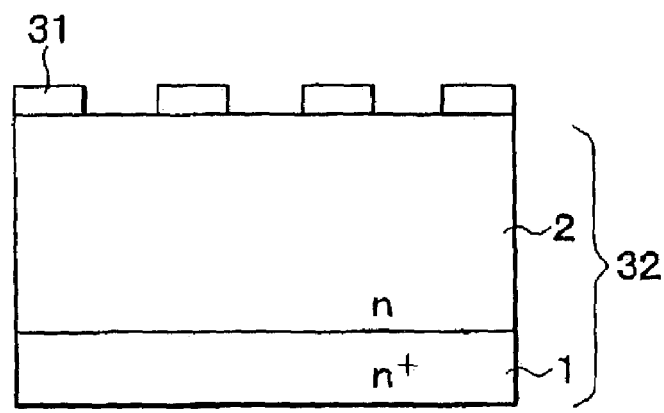
FIGS. 3A to 3J are schematic cross-sectional views showing the steps for manufacturing the device in FIG. 1.

[Steps shown in FIG. 3A]

An n+-type substrate 1 that makes up an n+-type drain region 1 is prepared. An n-type drift layer 2, which has a predetermined dopant concentration to become n-type drift regions 2, is formed on the n+-type substrate 1 to form a semiconductor substrate 32. The dopant concentration is, for example, $1\times10^{16}$ to $1\times10^{17}$ cm$^{-3}$. The dopant concentration may have other value as long as the concentration is within the range of $1\times10^{15}$ to $1\times10^{16}$ cm$^{-3}$.

Then, a silicon oxide film 31, which is used as an etching mask for forming trenches, is formed on a surface of the n-type drift layer 2. Although not illustrated in the figure, a photoresist is coated on the silicon oxide film 31. The photoresist is patterned out using photolithography, and the silicon oxide film 31 is partially etched using the patterned photoresist as an etching mask. With the etching, the openings, through which the n-type drift layer 2 is etched, are formed in the silicon oxide film 31. Then, the photoresist is removed.

Figure 3B:
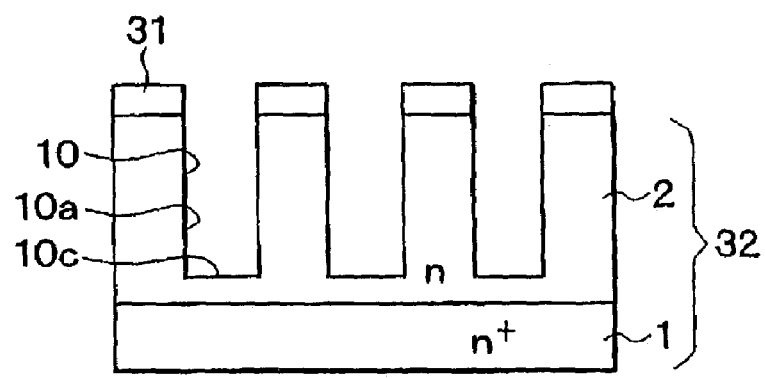

[Steps shown in FIG. 3B]

Then, the surface area of the n-type drift layer 2, or the surface area of the semiconductor substrate 32, is selectively etched using the patterned silicon oxide film 31 as a mask. The surface area of the n-type drift layer 2 is anisotropically etched with dry etching such as reactive ion etching (RIE) or wet etching. With the etching, epitaxial trenches 10, which are defined by sidewall surfaces 10*a* and bottom surfaces 10*c*, are formed in the surface area of the n-type drift layer 2. At that time, the bottom surfaces 10*c* are located at a level higher than the upper surface of the n$^+$-type substrate 1, as shown in FIG. 3B

[Steps shown in Fig. C]

Then, the surface of the n-type drift layer 2, or the surface of the semiconductor substrate 32, and the surfaces defining the epitaxial trenches 10 are treated using hydrofluoric acid (HF) aqueous solution. With the treatment, natural oxide films that exist on the surfaces of the epitaxial trenches 10 or the surface of the semiconductor substrate 32 are removed, and the silicon oxide film 31 that has been used as a mask is simultaneously removed.

After a dry etching such as RIE is carried out, reaction product residues are likely to adhere to the surfaces defining the epitaxial trenches 10. It is effective to cleanse the surfaces defining the epitaxial trenches 10 using a mixture of sulfuric acid ($H_2SO_4$) aqueous solution and hydrogen peroxide ($H_2O_2$) aqueous solution prior to the cleansing using HF aqueous solution in order to remove the reaction products.

Figure 3C:
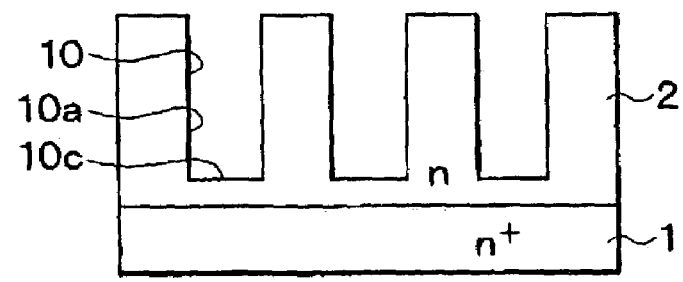
Figure 3D:
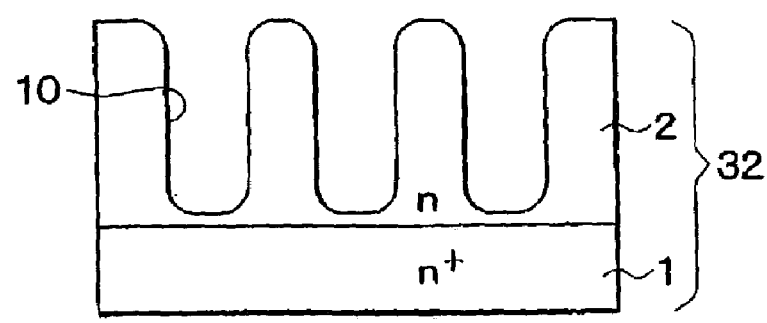

[Steps shown in FIG. 3D]

Next, the substrate 32 is heated in a non-oxidizing and non-nitridizing atmosphere, the pressure of which is lower than that of the air, in order to smooth the surfaces of the epitaxial trenches 10 and in order to cure the crystallographic defects located in the surfaces. The heating treatment is treated in an atmosphere containing a dopant gas. Specifically, hydrogen or a rare gas such as helium (He) and argon (Ar) is used as a non-oxidizing and non-nitridizing gas, and the atmosphere has a pressure of, for example, 1 to 600 torr (1 torr=ca. 133 Pa), which is lower than the atmospheric pressure.

The heating temperature is, for example, higher than 900° C. and lower than the melting point of the substrate 32, for example, lower than 1200° C. It is preferred that the heating temperature be high to cure the crystallographic defects located in the surfaces defining the epitaxial trenches 10. However, too high temperature causes the substrate 32 to warp. According to the experiments conducted by the inventors of the present invention in consideration of the above two aspects, the heating temperature is preferably in the range of 1000 to 1150° C.

The heating time is determined on the basis of the level of the crystallographic defects located in the surfaces of the epitaxial trenches 10 and the heating temperature. An n-type dopant, the conductivity type of which is the same as that of the dopant contained in the n-type drift layer 2, is used. As a gas containing an n-type dopant, for example, a compound including phosphorus (P) such as phosphine ($PH_3$) or a compound including arsenic (As) such as arsine ($AsH_3$) is used. In addition to P and As, elements such as antimony (Sb) may be used as an n-type dopant, and the heating treatment can be carried out using a compound including the n-type dopant.

In addition to the above conditions, other conditions such as the dopant gas concentration in the atmosphere of the heating treatment are set such that the dopant concentration in the n-type drift layer 2, in which the epitaxial trenches 10 have been formed, remains unchanged from predetermined one before the heating treatment is carried out. In this way, it is possible to maintain the dopant concentration in the n-type drift layer 2, in which the epitaxial trenches 10 have been formed, to be the predetermined one before the heating treatment is implemented by carrying out the heating treatment in the atmosphere containing the dopant gas. Thus, it is possible to suppress the change of the dopant concentration in the n-type drift layer 2 after the heating treatment even if the heating treatment is implemented in a non-oxidizing and non-nitridizing atmosphere.

With respect to the reason why the dopant concentration in the n-type drift layer 2 is maintained, for example, the following two mechanisms are speculated. One of the two mechanism is that although the dopant contained in the n-type drift layer 2 outdiffuses into the heating treatment atmosphere during the heating treatment, the dopant contained in the heating treatment atmosphere simultaneously diffuses into the n-type drift layer 2 to maintain the dopant concentration in the n-type drift layer 2. The other mechanism is that because the dopant is contained in the heating treatment atmosphere in advance, the outdiffusing of the dopant contained in the n-type drift layer 2 is suppressed by the dopant contained in the heating treatment atmosphere.

In the above explanation, the meaning that the dopant concentration in the n-type drift layer 2 is maintained at a predetermined is that it is maintained in the range that should be allowed in consideration of the production of semiconductor devices, that is, in the error range.

Figure 3E:
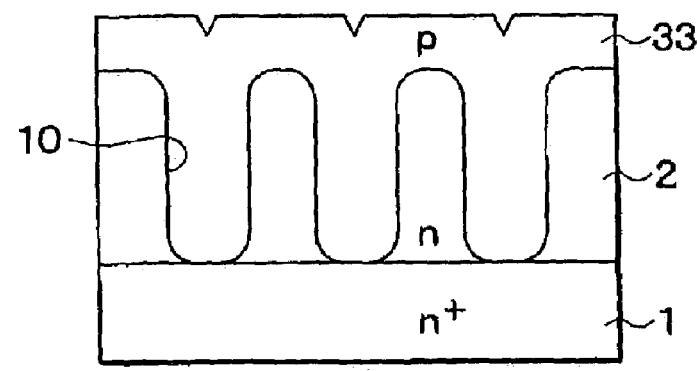

[Steps shown in FIG. 3E]

Then, an epitaxially grown film 33, or a p-type layer 33 is formed on the n-type drift layer 2, which includes the epitaxial trenches 10, by epitaxial growth. At that time, since the surfaces defining the epitaxial trenches 10 have been smoothed and the crystallographic defects located in the surfaces have been cured at the step shown in FIG. 3D, a p-type layer 33 that has few defects is formed. Specifically, the p-type layer 33 is made up of two p-type layers 33*a*, 33*b* and formed using the method shown by FIGS. 4A to 4C.

Figure 4A:
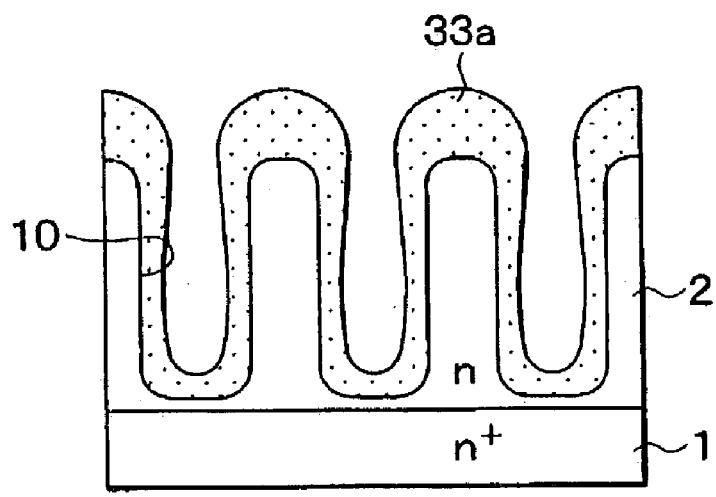
FIGS. 4A to 4C are schematic cross-sectional views for explaining the step of FIG. 3E.
Figure 4B:
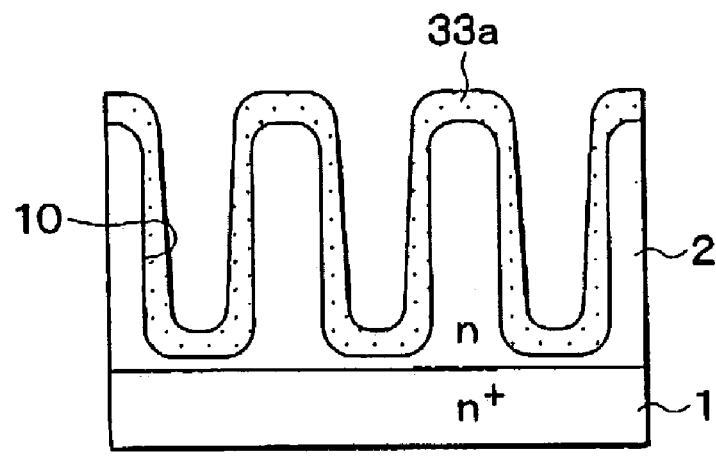

As shown in FIG. 4A, the first p-type layer 33*a* is formed on the upper surface of the n-type drift layer 2 and on the surfaces defining the epitaxial trenches 10 by epitaxial growth. Subsequently, as shown in FIG. 4B, the first p-type layer 33*a* is etched using a halogenoid compound gas such as hydrogen chloride (HCl) gas. At that time, the etching is treated using etching parameters that permit the first p-type layer 33*a* to be selectively etched near the top of the epitaxial trenches 10 such that the first p-type layer 33*a* is etched less on the bottom surfaces 10*c* of the epitaxial trenches 10. With the above etching, the top of the trenches that have been formed in the epitaxial trenches 10 and are defined by the first p-type layer 33*a* are widened.

Figure 4C:
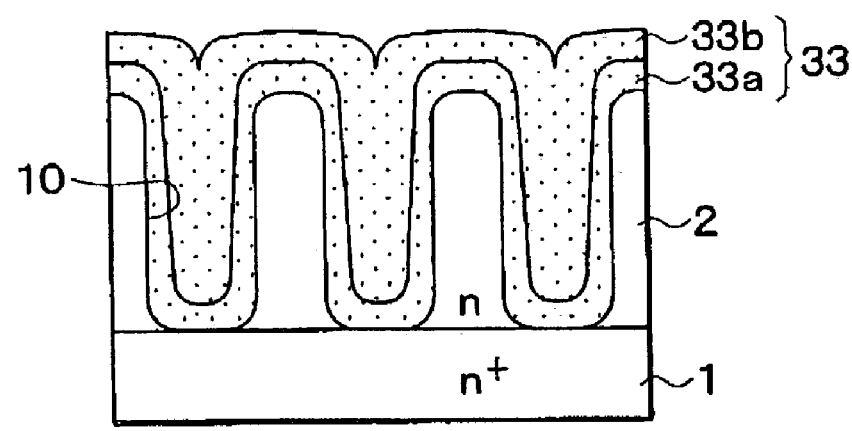

Next, as shown in FIG. 4C, the second p-type layer 33*b* is formed on the first p-type layer 33*a* by epitaxial growth to form a p-type layer 33. At that time, if a p-type layer 33 was formed without the above etching, the p-type layer 33 would close the top of the epitaxial trenches 10 before the epitaxial trenches 10 are completely filled. Therefore, a void is generated in the p-type layer 33, In contrast, in this embodiment, it-is possible to prevent the epitaxial trenches 10 from closing because the first p-type layer 33*a* is selectively etched near the top of the epitaxial trenches 10 at the step shown in FIG. 4B. Therefore, the generation of the void in the filling p-type layer 33 is suppressed. Then, the substrate 32 is heated in a non-oxidizing and non-nitridizing atmosphere with a pressure of 1 to 600 torr. With the heating treatment, even if voids exist in the p-type layer 33 formed to fill the epitaxial trenches 10, the voids shrink due to the rearrangement of surface silicon atoms of the initial voids.

After the steps shown in FIG. 3E, the bottom surfaces 10c of the epitaxial trenches 10 and the upper surface of the n+-type substrate 1 are consolidated because the dopant contained in the n+-type substrate 1 diffuses into the n-type drift layer 2 due to the heating treatment at the steps shown in FIG. 3D and the heating treatment at the steps shown in FIG. 4C. In this embodiment, the epitaxial trenches 10 are formed in the n-type drift layer 2 such that the bottom surfaces 10c are located at a level higher than the upper surface of the n+-type substrate 1. However, the epitaxial trenches 10 may be formed to extend through the n-type drift layer 2 such that the bottom surfaces 10c reach the n+-type substrate 1.

In that case as well, the dopant concentrations in the n-type drift layer 2, in which the epitaxial trenches 10 have been formed, in the n+-type substrate 1 remains unchanged from the ones before the heating treatments are treated.

Figure 3F:
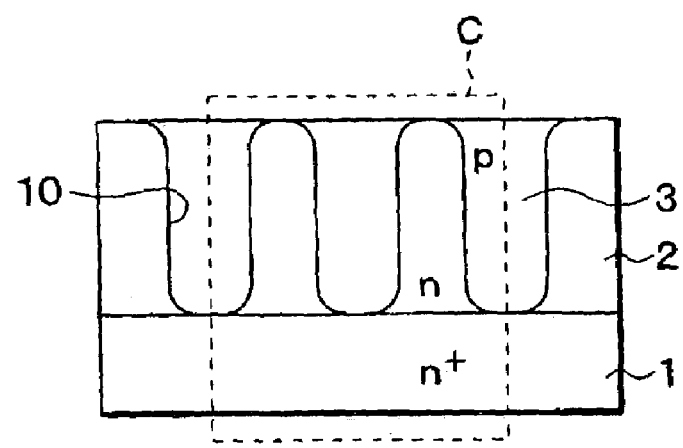

[Steps shown in FIG. 3F]

The p-type layer 33 is planarized by Chemical Mechanical Polishing (CMP) to the height of the top surface of the n-type drift layer 2 to form an alternate arrangement of n-type drift regions 2 and p-type silicon regions 3.

Figure 3G:
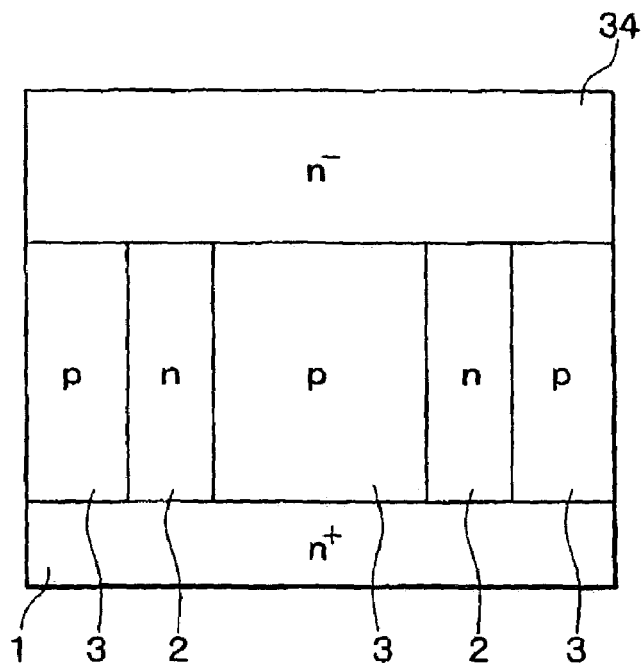

[Steps shown in FIG. 3G]

FIGS. 3G to 3J are cross-sectional views at the area corresponding to the area C in FIG. 3F. In these figures, the roundness at the top and the bottoms of the epitaxial trenches 10 is omitted. At the steps shown in FIG. 3G, an n-type 34 is formed by epitaxial growth.

Figure 3H:
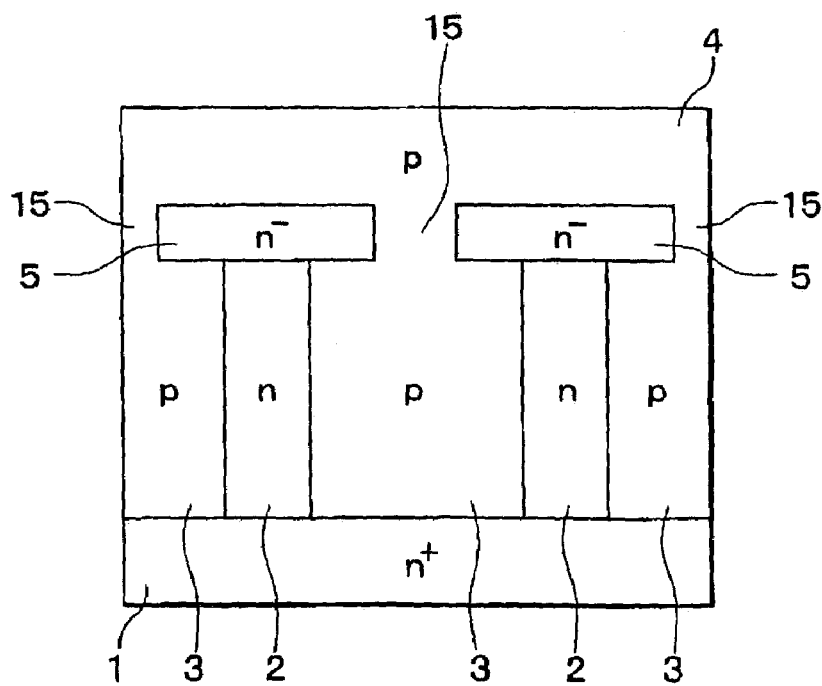

[Steps shown in FIG. 3H]

A p-type dopant is added to the n-type layer 34 at the central area of the portions located on the p-type silicon regions 3 by ion implantation. As a result, p-type connection region 15 are formed, and upper n-type silicon regions 5 defined by the p-type connection region 15 are formed at the same time. Then, a p-type dopant is added to the entire regions above the upper n-type silicon regions 5 by, for example, ion implantation. As a result, a p-type base layer 4, from which p-type base regions 4 are formed, is formed.

Figure 3I:
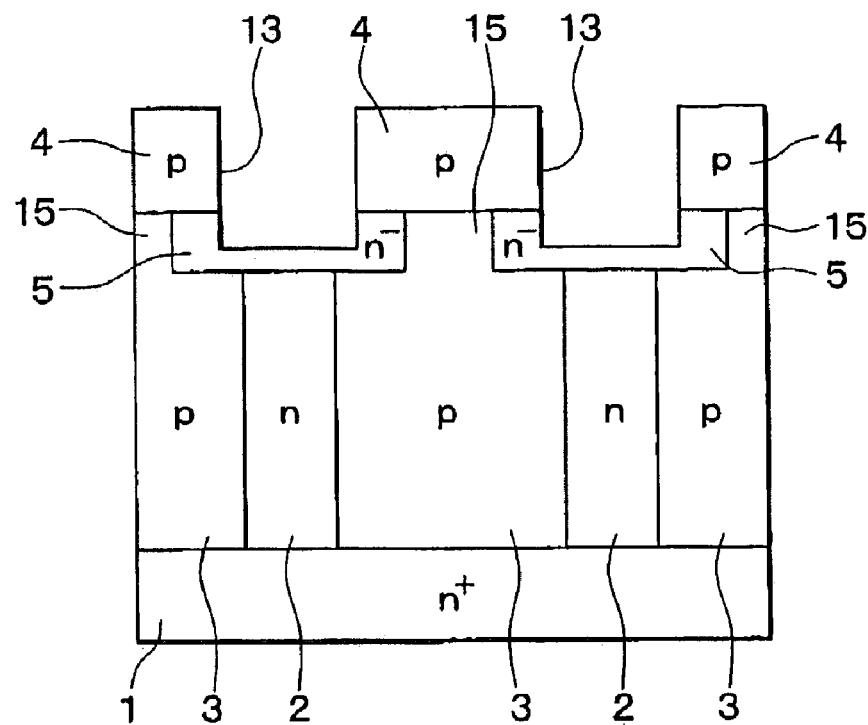

[Steps shown in FIG. 3I]

Then, gate trenches 13 that reach the upper n-type silicon regions 5 at their central areas through the p-type base layer 4 are formed right above the n-type drift regions 2 by dry etching using a resist as a mask.

Figure 3J:
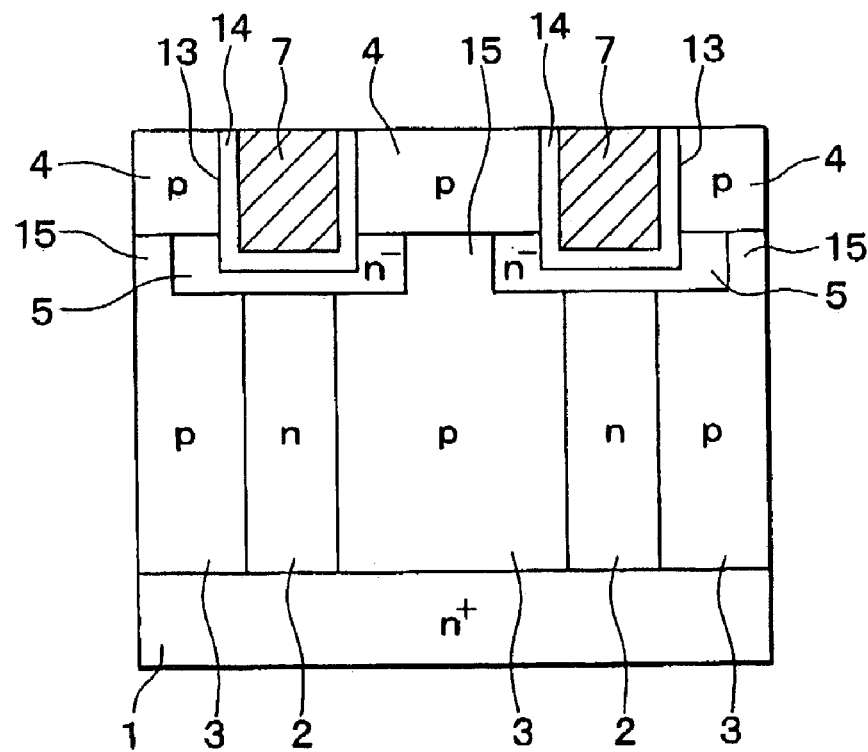

[Steps shown in FIG. 3J]

Then, silicon oxide films 14 are formed on the sidewall surfaces and bottom surfaces defining the gate trenches 13 by, for example, CVD. Thereafter, gate electrodes 7 made of polysilicon are formed on the silicon oxide films 14 by, for example, CVD. Finally, as shown in FIG. 2, n+-type source regions 6 are formed in the surfaces of the base layer 4 by, for example, implanting arsenic or phosphorus ions. Then, p+-type base contact regions 12 are formed in the surfaces of the base layer 4 by, for example, implanting boron ions. With the above steps, the power MOSFET shown in FIGS. 1 and 2 is manufactured.

Unless the heating treatments are implemented in a non-oxidizing and non-nitridizing atmosphere containing a dopant gas, the dopant concentration of the semiconductor substrate 32, in which the epitaxial trenches 10 have been formed, can vary. Especially, in the power MOSFET having a super junction structure, it is necessary to strictly control the dopant concentrations of the n-type drift regions 2 and the p-type silicon regions 3, which make up a super junction, in order to completely deplete those regions. Therefore, it is inevitable to suppress the dopant concentration variation of the n-type drift regions 2.

In this embodiment, as described above, the substrate 32 is heated in a non-oxidizing and non-nitridizing atmosphere with a pressure of 1 to 600 Tort containing a gas that includes an n-type dopant, the conductivity type of which is the same as that of the dopant contained in the n-type drift layer 2, in order to smooth the surfaces of the epitaxial trenches 10. Therefore, even if the heating treatment is implemented in a non-oxidizing and non-nitridizing atmosphere after the epitaxial trenches 10 are formed in the n-type drift layer 2 that has a predetermined dopant concentration, it is possible to maintain the predetermined dopant concentration of the n-type drift layer 2. That is, it is possible to suppress the change of the dopant concentration in the n-type drift layer 2. Therefore, according to the present invention, it is possible to precisely control the dopant concentration of the n-type drift layer 2 even if the heating treatment is treated in a non-oxidizing and non-nitridizing atmosphere.

In this embodiment, the epitaxial trenches 10, which are formed in the n-type drift layer 2, are filled with the p-type silicon layer 3 to form the alternate arrangement of the n-type drift regions 2 and the p-type silicon regions 3. However, the alternate arrangement can be formed in the opposite order. That is, a p-type silicon layer 3 may be formed first, and then the trenches formed in the p-type silicon layer 3 may be filled with an n-type drift layer 2.

In the case that a p-type silicon layer 3 is formed first, a p-type dopant, the conductivity type of which is the same as that of the dopant contained in the p-type silicon layer 3, is used. As a gas containing a p-type dopant, for example, a compound including boron (B) such as diborane ($B_2H_6$) is used. The other conditions are the same that has been explained above.

Second Embodiment

Figure 5:
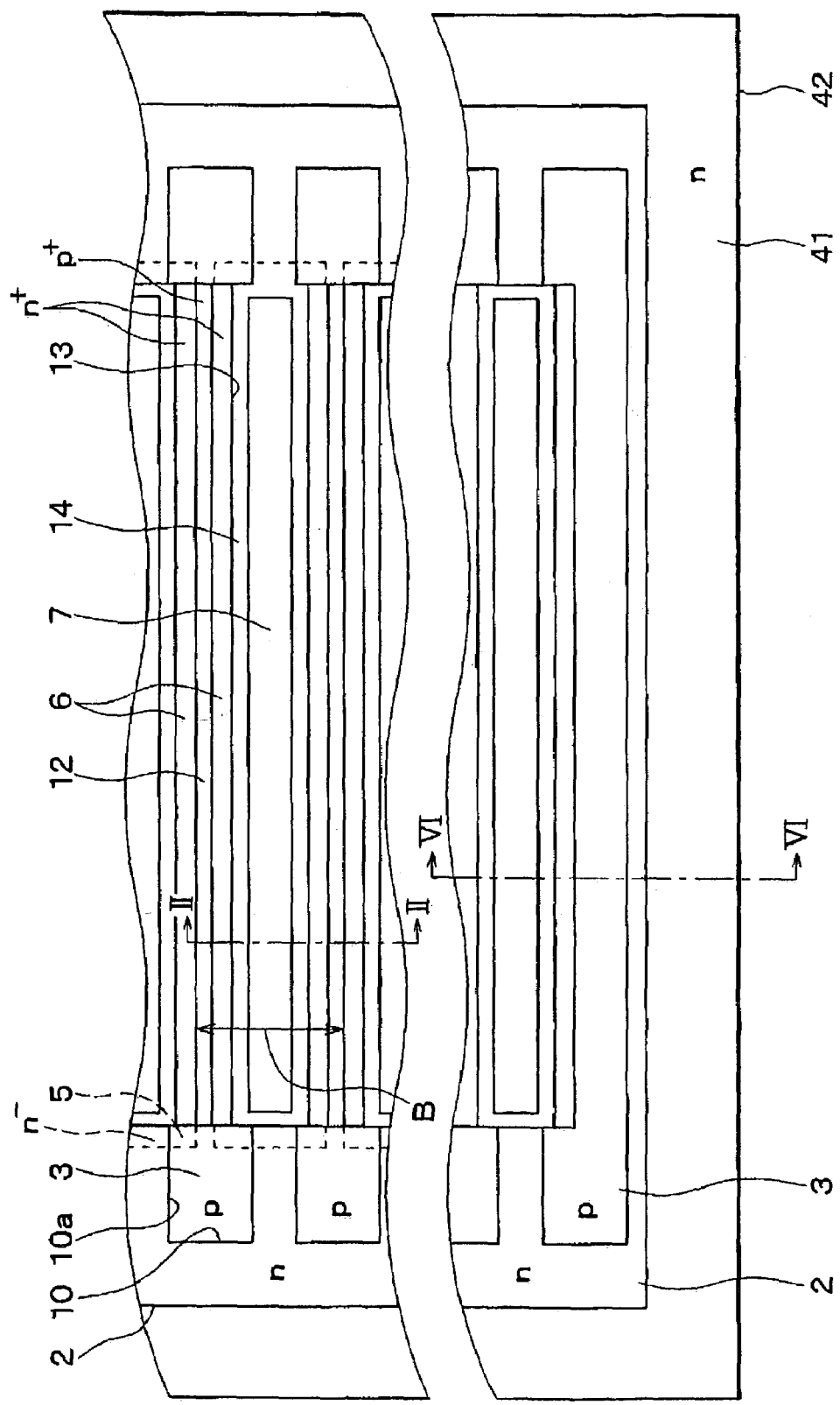
FIG. 5 is a partial schematic plan view of a semiconductor device according to a second embodiment.
Figure 6:
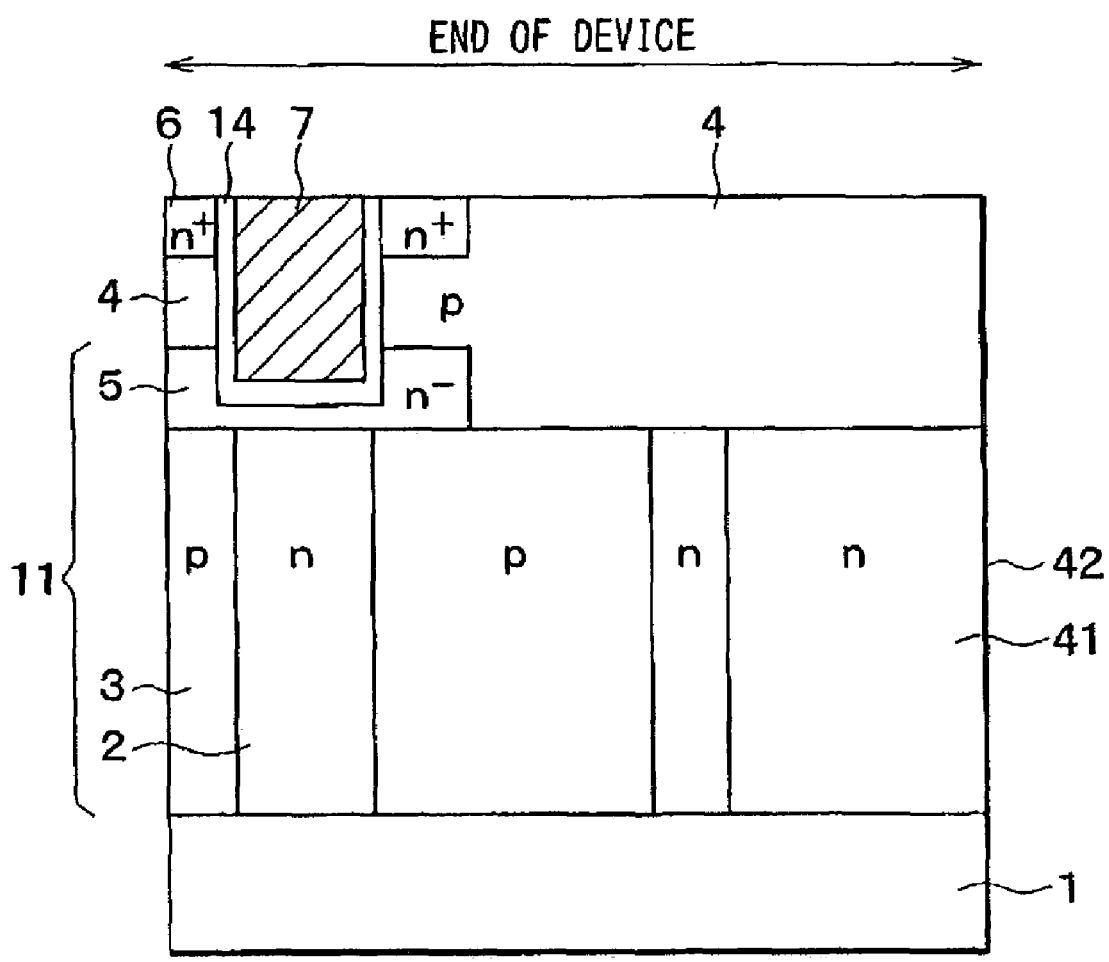
FIG. 6 is a schematic cross-sectional view of the device in FIG. 5 taken along the line VI—VI.

FIG. 5 is a partial schematic plan view of a power MOSFET having a super junction structure according to a second embodiment. FIG. 6 is a schematic cross-sectional view of the device in FIG. 5 taken along the line VI—VI. The cross-sectional structure of the device of FIG. 5 taken along the line II—II in FIG. 5 is the same as that shown in FIG. 2, and the portion that has the cross-sectional structure along the line II—II in FIG. 5 is a unit element. The cross-sectional view, which is shown in FIG. 6, of the device of FIG. 5 taken along the line VI—VI in FIG. 5 shows an end of the power MOSFET of FIG. 5.

The power MOSFET according to this embodiment has the structure in which a low dopant concentration region 41 is added to the power MOSFET shown in FIG. 1 around the super junction such that the low dopant concentration region 41 has a dopant concentration lower than the regions that make up the super junction. There are no differences in other aspects. Therefore, the explanations on the other aspects are omitted, and the same elements are denoted using the same symbols.

Specifically, as shown in FIGS. 5 and 6, the low dopant concentration n-type region 41 is located outside the super junction 11, or an alternately arranged area 11, where the n-type drift regions 2 and the p-type silicon regions 3 are alternately arranged, at the peripheral ends of a power MOSFET having a super junction structure. The n-type drift regions 2 have, for example, a dopant concentration of $1 \times 10^{16}$ to $1 \times 10^{17}$ $cm^{-3}$, as well as in the first embodiment. The low dopant concentration n-type region 41 has, for example, a dopant concentration of $1 \times 10^{14}$ to $1 \times 10^{16}$ $cm^{-3}$. In this way, the low dopant concentration region 41 has a dopant concentration lower than the n-type drift regions 2.

As explained in the first embodiment, when a reverse voltage, is applied between the source electrode and the drain electrode of a power MOSFET having super junction 11, depletion layers extend from the pn junctions 10a to completely deplete the n-type drift regions 2 and the p-type silicon regions 3, which make up the super junction 11. With the complete depletion, the power MOSFET secures high breakdown voltage.

However, in the structure of FIGS. 1 and 2, in which the epitaxial trenches 10 are located in the n-type drift regions 2 and the p-type silicon regions 3 are located in the epitaxial trenches 10, the outermost ends of the super junction 11 qre necessarily terminated by an n-type drift region 2. No pn junction is formed at the outermost end 42 of the n-type drift region 2. Therefore, the breakdown voltage at the outermost ends of the super junction 11 is determined the dopant concentration, or carrier concentration, in the n-type drift region 2 located at the outermost ends of the super junction 11.

Therefore, even if high breakdown voltage can be secured inside the super junction 11, high breakdown voltage can not be secured outside the super junction 11. As a result, the overall breakdown voltage of the power MOSFET of FIGS. 1 and 2 can not be high enough.

The above problem is thought to be solved by extending the alternate arrangement of the n-type drift regions 2 and the p-type silicon regions 3 at the outermost ends of the device. However, in this method, it is necessary to form an additional alternate arrangement that requires a width that is longer length than the depth of the n-type drift regions 2 and the p-type silicon regions 3. As a result, the device needs to be enlarged.

In contrast, in this embodiment, the low dopant concentration n-type region 41 is formed at the outermost ends of the super junction 11, so it is possible to increase the breakdown voltage in comparison with the structure in which no low dopant concentration n-type region 41 is formed. In addition, the width of the low dopant concentration n-type region 41 is smaller than those of the n-type drift regions 2 and the p-type silicon regions 3. Therefore, the device does not need to be unnecessarily enlarged.

Figure 7A:
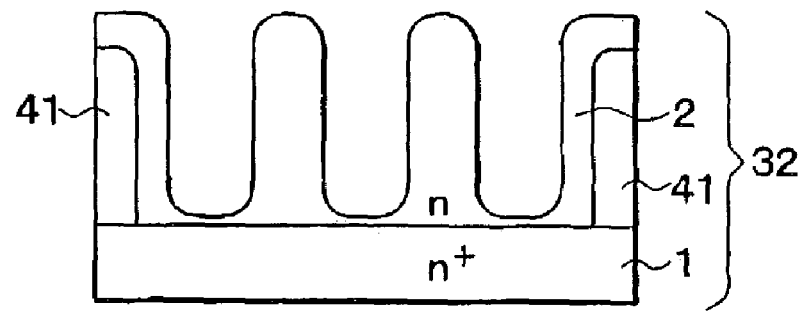
FIGS. 7A to 7C are schematic cross-sectional views showing the steps for manufacturing the device in FIG. 5.
Figure 7B:
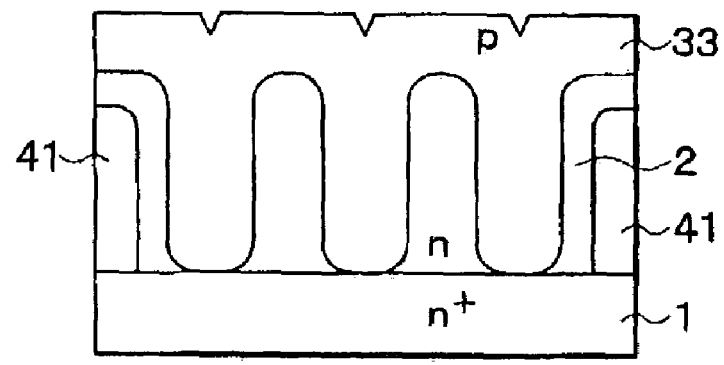
Figure 7C:
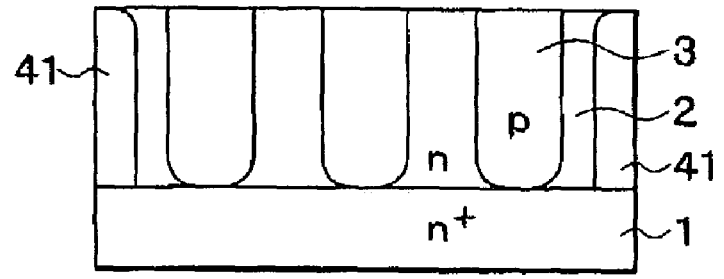
Figure 8A:
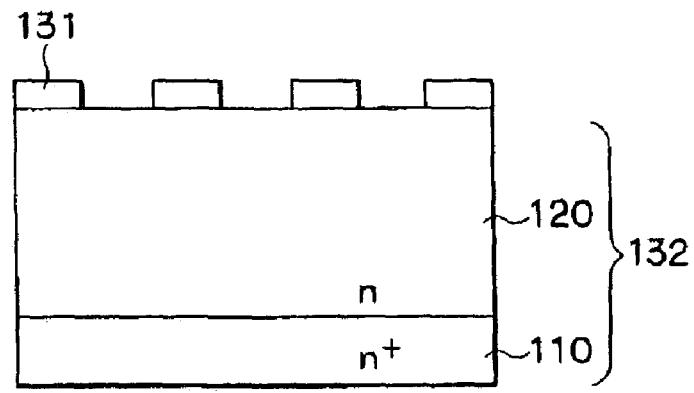
FIGS. 8A to 8F are schematic cross-sectional views showing the steps for manufacturing a proposed semiconductor device.
Figure 8B:
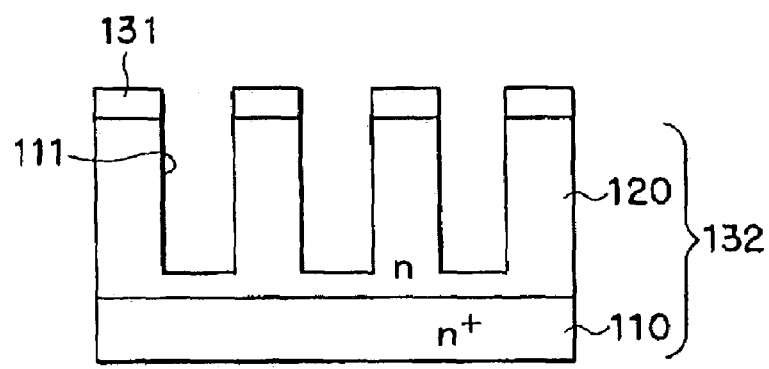
Figure 8C:
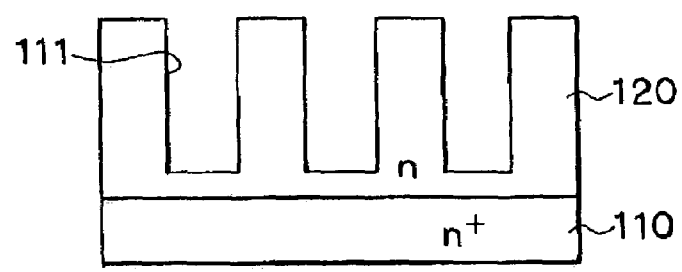
Figure 8D:
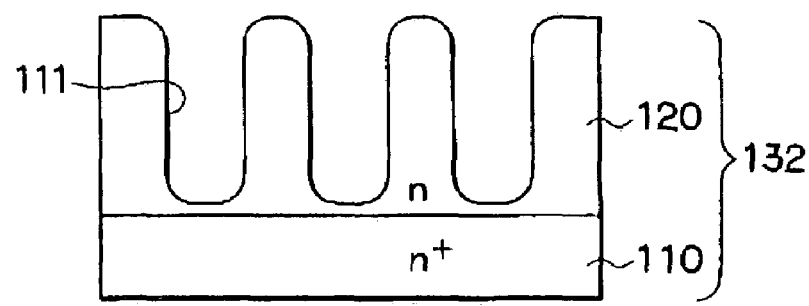
Figure 8E:
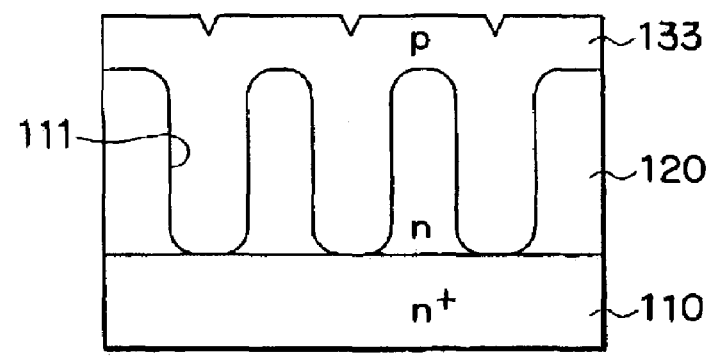
Figure 8F:
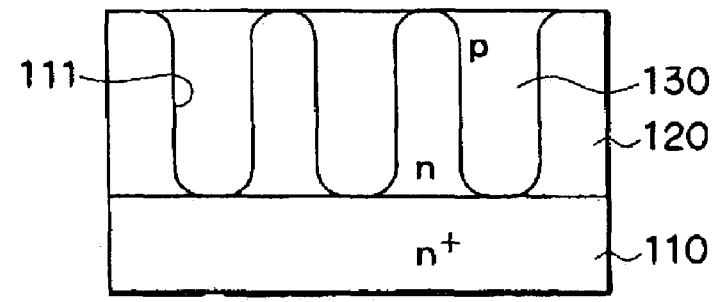

Next, the method for manufacturing this semiconductor device will be explained. FIGS. 7A to 7C are schematic cross-sectional views showing part of the process for manufacturing the semiconductor device in this embodiment. The method for manufacturing the power MOSFET in this embodiment basically differs from that in the first embodiment in the dopant concentration of the n-type drift regions 2, and there are no differences in other aspects. Therefore, the explanation will be made only on the steps different from the steps shown in FIGS. 3A to 3F in the first embodiment.

Specifically, at the steps shown in FIG. 3A, an n-type drift layer 2, which has a dopant concentration lower than that in the first embodiment to become n-type drift regions 2, is formed. In the first embodiment, when the n-type drift layer 2 is formed on the $n^+$-type substrate 1, the dopant concentration of the n-type drift layer 2 is set to be equal to a predetermined dopant concentration in a completed semiconductor device. On the other hand, in this embodiment, the dopant concentration of the n-type drift layer 2 is set to be lower than the predetermined dopant concentration. The dopant concentration is, for example, $1\times10^{14}$ to $1\times10^{16}$ $cm^{-1}$. The dopant concentration may have other value as long as the concentration is within the range of $1\times10^{14}$ to $1\times10^{18}$ $cm^{-3}$. The n-type drift layer 2, the dopant concentration of which is set to be lower than the predetermined dopant concentration, is a predetermined layer 2, or, a semiconductor layer 2.

Subsequently, the steps shown in FIGS. 3B and 3C are carried out. Then, the steps shown in FIGS. 7A to 7C, which correspond to the ones shown in FIGS. 3D to 3F, are treated. In FIGS. 7A to 7C, the central area of a substrate 32 is omitted to illustrate the outermost ends of the substrate 32, where the ends of a device are formed. At the steps shown in FIG. 7A, the substrate 32 is heated in a non-oxidizing and non-nitridizing atmosphere with a pressure of 1 to 600 Torr containing an n-type dopant gas.

In this embodiment, the dopant contained in the heating treatment atmosphere is diffused into the n-type drift layer 2, in which epitaxial trenches 10 have been formed. At that time, the dopant concentration in the heating treatment atmosphere is set such that the dopant concentration in the diffused region of the n-type drift layer 2 becomes, for example, $1\times10^{16}$ to $1\times10^{17}$ $cm^{-3}$. Other conditions that do not affect the dopant concentration in the diffused region are set to be the same as in the first embodiment.

With the above steps, it is possible to set the dopant concentration in the diffused region to be the predetermined one. In the area where a device is formed, the dopant contained in the heating treatment atmosphere is diffused into the n-type drift layer 2 from its upper surface and the sidewall surfaces 10a of the epitaxial trenches 10 such that the entire n-type drift layer 2 has a homogeneous dopant concentration.

In contrast, no trenches 10 are formed in the n-type drift layer 2 at the areas where the ends of a device are formed because no p-type silicon regions 3 are formed at the outermost ends of the device. Therefore, the undiffused portions of the n-type drift layer 2 at the outermost ends of the n-type drift layer 2 remains having the same dopant concentration as that before the heating treatment is treated. Here, the undiffused portions are ones that are distant-from the upper surface of the n-type drift layer 2 and the trenches 10. In other words, the undiffused portions are ones that are distant from the surfaces exposed by the heating treatment atmosphere.

In this way, a low dopant concentration region 41 is left at the outermost ends of the n-type drift layer 2, the dopant concentration of which is set to be lower than the predetermined dopant concentration, and a doped n-type drift layer 2, which has the predetermined dopant concentration, is formed at the area except for the outermost ends. In that manner, a low dopant concentration region 41 is formed outside the super, junction 11.

Then, p-type layer 33 is formed at the steps shown in FIG. 7B. Subsequently, the p-type layer 33 is planarized by CMP to the height of the top surface of the n-type drift layer 2 to form an alternate arrangement of n-type drift regions 2 and p-type silicon regions 3. Then, the steps shown in FIGS. 3G to 3J are sequentially carried out in the same manner as the first embodiment to complete the power MOSFET shown in FIGS. 5 and 6.

As described above, in this embodiment, the dopant concentration of the n-type drift layer 2 is set to be lower than the predetermined dopant concentration when the n-type drift layer 2 is formed on the $n^+$-type substrate 1. Then, the substrate 32 is heated in a non-oxidizing and non-nitridizing atmosphere with a pressure of 1 to 600 Torr containing an n-type dopant gas. At that time, the dopant contained in the heating treatment atmosphere is diffused into the n-type drift layer 2 to supply the dopant to the n-type drift layer 2.

With this method as well, it is possible to set the dopant concentration in n-type drift regions 2 to be the predetermined one. That is, it is possible to precisely control the dopant concentration of the n-type drift regions 2 even if the heating treatment is treated in a non-oxidizing and non-nitridizing atmosphere.

If the super junction 11 was extended to the outermost ends of the device to improve the breakdown voltage at the outermost ends, the dimensions of the super junction 11 would undesirably increase. In contrast, in this embodiment, the low dopant concentration region 41 is adjacently located outside the super junction 11 at the outermost ends of the device. The low dopant concentration region 41 can be set to be shorter than the depth of the n-type drift regions 2 and the p-type silicon regions 3. Therefore, it is possible to reduce the dimensions of the device in comparison with the method in which the super junction 11 is extended to the outermost ends of the device.

The low dopant concentration region 41 could be formed at the outermost ends of the device separately from the steps of forming the super junction 11. However, in this embodiment, the low dopant concentration region 41 is simultaneously formed at the outermost ends of the device at the steps of forming the super junction 11. Therefore, it is possible to reduce the production steps in comparison with the case that low dopant concentration region 41 is separately formed.

In this embodiment, the n-type drift layer 2, which has the same conductivity type as the n-type drift regions 2 and has a dopant concentration lower than that of the n-type drift regions 2, is formed on the $n^+$-type substrate 1 at the steps shown in FIG. 3A. However, the n-type drift layer 2 can be substituted by a p-type layer, which is different in conductivity type from the n-type drift layer 2. In that case as well, the dopant concentration of the p-type layer is set to be lower than the dopant concentration of the p-type silicon regions 3 that will be included in a completed semiconductor device. The substrate 32 is heated in a non-oxidizing and non-nitridizing atmosphere with a pressure of 1 to 600 Torr containing a gas that includes an n-type dopant, the conductivity type of which is different from that of the dopant contained in the p-type layer. The n-type drift layer 2 is formed on the $n^+$-type substrate 1 by diffusing the n-type dopant into the p-type layer.

At that time, the diffusion is controlled such that undiffused portions of the p-type layer, which have the same dopant concentration as that before the diffusion is carried out, are left at the outermost ends of the p-type layer. In this way, a low dopant concentration p-type region, which is also called a predetermined layer or a semiconductor layer, is left at the outermost ends, and the n-type drift layer 2 is formed at the area except for the outermost ends. Therefore, it is possible to form the p-type region, which has a dopant concentration lower than the p-type silicon regions 3 and is adjacently located outside the n-type drift layer 2.

In this instance as well, the low dopant concentration p-type region is formed at the outermost ends of the super junction 11, so it is possible to increase the breakdown voltage. In the same manner as in the first embodiment, a p-type silicon layer 3 may be formed first, and then the trenches formed in the p-type silicon layer 3 may be filled with an n-type drift layer 2 when the alternate arrangement of the n-type drift regions 2 and the p-type silicon regions 3 is formed.

Other Embodiment

The semiconductor device in the first embodiment can be manufactured using the method for manufacturing the semiconductor device in the second embodiment. That is, although the low dopant concentration region 41 is formed at the outermost ends at the steps of forming the super junction 11 in the second embodiment, the low dopant concentration region 41 may not be formed. In other words, although the substrate 32 is heated in a non-oxidizing and non-nitridizing atmosphere such that the dopant concentration in the n-type drift layer 2 is maintained to be the predetermined one in the first embodiment, it is possible to permit the n-type drift layer 2 to have the predetermined dopant concentration by diffusing the dopant that has been added to the heating atmosphere into the n-type drift layer 2 to increase the dopant concentration in the n-type drift layer 2.

In this instance as well, as explained in the second embodiment, the n-type drift layer 2 can be substituted by a p-type layer, which is different in conductivity type from the n-type drift layer 2. In that case, the dopant concentration of the p-type layer is set to be lower than the dopant concentration of the p-type silicon regions 3, and the substrate 32 is heated in a non-oxidizing and non-nitridizing atmosphere with a pressure of 1 to 600 Torr containing a gas that includes an n-type dopant. The n-type drift layer 2 is formed on the $n^+$-type substrate 1 by diffusing the n-type dopant into the p-type layer.

Each power MOSFET in the above embodiments is an n channel power MOSFET, in which the first conductivity type is n-type and the second conductivity type is p-type. However, the present invention can be applied to a p channel power MOSFET, in which the conductivity types of the elements are opposite to those in the n channel power MOSFET.

In the above embodiments, the present invention has been applied to power MOSFETs. However, the present invention can be applied to IGBT, in which a collector is substituted for the drain and an emitter is substituted for the source, and thyristor.

The semiconductor devices in the above embodiments are power MOSFETs having a super junction structure. However, the present invention can be applied to other semiconductor device, in the manufacturing process of which a trench is filled with an epitaxially grown film.

What is claimed is:

1. A method for manufacturing a semiconductor device, the method comprising:
  forming a trench in a predetermined layer of a semiconductor substrate;
  heating the substrate having the trench in a non-oxidizing and non-nitridizing atmosphere containing a dopant or a compound that includes the dopant in order to smooth surfaces of the trench and to maintain a dopant concentration in the predetermined layer to be a predetermined concentration before the heating, wherein the conductivity type of the dopant contained in the non-oxidizing and non-nitridizing atmosphere is the same as that of a dopant initially contained in the predetermined layer; and
  forming an epitaxially grown film to fill the trench.

2. The method according to claim 1, wherein a dopant concentration in the non-oxidizing and non-nitridizing atmosphere is within the range of $1 \times 10^{15}$ to $1 \times 10^{18}$ cm$^{-3}$.

3. The method according to claim 1, wherein the non-oxidizing and non-nitridizing atmosphere includes hydrogen or a rare gas.

4. The method according to claim 1, wherein the non-oxidizing and non-nitridizing atmosphere has a pressure lower than that of the atmospheric pressure.

5. The method according to claim 1, wherein the dopant contained in the non-oxidizing and non-nitridizing atmosphere is one element selected from the group consisting of boron (B), phosphorus (P), arsenic (As), and antimony (Sb).

6. The method according to claim 1, wherein the semiconductor layer is heated at a temperature in the range of 1000 to 1150° C.

7. A method for manufacturing a semiconductor device, the method comprising:
forming one layer out of a first conductivity type drift layer and a second conductivity type layer on a first conductivity type semiconductor substrate, which forms a drain region;
forming first trenches in a surface of the one layer;
heating the one layer having the first trenches in a non-oxidizing and non-nitridizing atmosphere containing a dopant or a compound that includes the dopant in order to smooth surfaces of the first trenches and to maintain a dopant concentration in the one layer to be a predetermined concentration before the heating, wherein the conductivity type of the dopant is the same as that of a dopant contained in the one layer;
forming the other layer out of the first conductivity type drift layer and the second conductivity type layer to fill the first trenches by epitaxial growth in order to form an alternate arrangement of first conductivity type drift regions and second conductivity type first semiconductor regions;
forming first conductivity type second semiconductor regions on the first conductivity type drift regions;
forming a second conductivity type base layer on the first semiconductor regions and the second semiconductor regions;
forming second trenches that extend through the base layer to reach the second semiconductor regions;
forming gate insulating films on surfaces of the second trenches; and
forming gate electrodes on the gate insulating films.

8. The method according to claim 7, wherein the non-oxidizing and non-nitridizing atmosphere includes hydrogen or a rare gas.

9. The method according to claim 7, wherein the non-oxidizing and non-nitridizing atmosphere has a pressure lower than that of the atmospheric pressure.

10. The method according to claim 7, wherein the semiconductor layer is heated at a temperature in the range of 1000 to 1150° C.

11. A method for manufacturing a semiconductor device, the method comprising:
forming a trench in a predetermined layer of a semiconductor substrate;
heating the substrate having the trench in a non-oxidizing and non-nitridizing atmosphere containing a dopant or a compound that includes the dopant in order to smooth surfaces of the trench and to diffuse the dopant contained in the non-oxidizing and non-nitridizing atmosphere into the predetermined layer and partially increase a dopant concentration in the predetermined layer to be a predetermined concentration higher than that before the heating; and
forming an epitaxially grown film to fill the trench.

12. The method according to claim 11, wherein a dopant concentration in the predetermined layer is within the range of $1\times10^{15}$ to $1\times10^{18}$ cm$^{-3}$ and a dopant concentration in the one layer is within the range of $1\times10^{14}$ to $1\times10^{18}$ cm$^{-3}$.

13. The method according to claim 11, wherein the dopant contained in the non-oxidizing and non-nitridizing atmosphere has the same conductivity type as that of the predetermined layer.

14. The method according to claim 11, wherein the non-oxidizing and non-nitridizing atmosphere includes hydrogen or a rare gas.

15. The method according to claim 11, wherein the non-oxidizing and non-nitridizing atmosphere has a pressure lower than that of the atmospheric pressure.

16. The method according to claim 11, wherein the dopant contained in the non-oxidizing and non-nitridizing atmosphere is one element selected from the group consisting of boron (B), phosphorus (P), arsenic (As), and antimony (Sb).

17. The method according to claim 11, wherein the semiconductor layer is heated at a temperature in the range of 1000 to 1150° C.

18. A method for manufacturing a semiconductor device, the method comprising:
preparing a first conductivity type semiconductor substrate, which forms a drain region;
forming a semiconductor layer on the semiconductor substrate;
forming first trenches in a surface of the semiconductor layer;
heating the semiconductor layer having the first trenches in a non-oxidizing and non-nitridizing atmosphere containing a dopant or a compound that includes the dopant in order to smooth surfaces defining the first trenches and to diffuse the dopant contained in the non-oxidizing and non-nitridizing atmosphere into the semiconductor layer and partially increase a dopant concentration in the semiconductor layer to form one layer out of a first conductivity type drift layer and a second conductivity type layer on the semiconductor substrate that have a predetermined dopant concentration;
forming the other layer out of the first conductivity type drift layer and the second conductivity type layer to fill the first trenches by epitaxial growth in order to form an alternate arrangement of first conductivity type drift regions and second conductivity type first semiconductor regions;
forming first conductivity type second semiconductor regions on the first conductivity type drift regions;
forming a second conductivity type base layer on the first semiconductor regions and the second semiconductor regions;
forming second trenches that extend through the base layer to reach the second semiconductor regions;
forming gate insulating films on surfaces defining the second trenches; and
forming gate electrodes on the gate insulating films.

19. The method according to claim 18, wherein the semiconductor layer is formed to have a dopant concentration lower than that in the one layer out of the doped first conductivity type drift layer and the doped second conductivity type layer and wherein the semiconductor layer is heated such that the one layer is formed at an area except for outermost ends of the semiconductor layer and a low dopant concentration region is formed to be adjacently located outside the one layer at the outermost ends.

20. The method according to claim 18, wherein the dopant contained in the non-oxidizing and non-nitridizing atmosphere has the same conductivity type as that of the predetermined layer.

21. The method according to claim 18, wherein the non-oxidizing and non-nitridizing atmosphere includes hydrogen or a rare gas.

22. The method according to claim 18, wherein the non-oxidizing and non-nitridizing atmosphere has a pressure lower than that of the atmospheric pressure.

23. The method according to claim 18, wherein the semiconductor layer is heated at a temperature in the range of 1000 to 1150° C.

24. A semiconductor device comprising:
   a first conductivity type semiconductor substrate, which forms a drain region;
   first conductivity type drift regions;
   second conductivity type first semiconductor regions, wherein the drift regions and the first semiconductor regions are in alternate contact with each other to laterally form an alternately arranged area;
   first conductivity type second semiconductor regions, which are located on the drift regions;
   second conductivity type base regions, which are located on the first semiconductor regions and the second semiconductor regions;
   trenches, which extend through the base regions to reach the second semiconductor regions;
   gate insulating films, which are located on surfaces of the trenches;
   gate electrodes, which are located on the gate insulating films; and
   a low dopant concentration region, which is adjacently located outside the alternately arranged area, which is made of the drift regions and the first semiconductor regions, wherein the low dopant concentration region has a dopant concentration lower than those of the drift regions and the first semiconductor regions.

* * * * *